COMPENSATED OPERATIONAL AMPLIFIER

Filed Jan. 6, 1965 2 Sheets-Sheet 1

INVENTORS:
FRITZ H. SCHLERETH,
ROBERT J. McFADYEN,
BY [signature]
THEIR ATTORNEY.

COMPENSATED OPERATIONAL AMPLIFIER

Filed Jan. 6, 1965 2 Sheets-Sheet 2

INVENTORS:
FRITZ H. SCHLERETH,
ROBERT J. McFADYEN,

BY [signature]
THEIR ATTORNEY.

United States Patent Office 3,392,287

Patented July 9, 1968

3,392,287

COMPENSATED OPERATIONAL AMPLIFIER

Robert J. McFadyen and Fritz H. Schlereth, Syracuse, N.Y., assignors to General Electric Company, a corporation of New York Filed Jan. 6, 1965, Ser. No. 423,679
2 Claims. (Cl. 307—230)

ABSTRACT OF THE DISCLOSURE

An operational amplifier having a diode network in the feedback path to provide a nonlinear transfer function, the open loop gain of the amplifier being made stable in the presence of variations in the feedback impedance by means of a compensating diode network connected in the feedthrough path having voltage-current characteristics which match those of the feedback network.

The invention relates to operational amplifiers and, in particular, to novel means for providing compensation to such amplifiers. More specifically, the invention relates to a novel compensated logarithmic amplifier which provides an output voltage proportional to the logarithm of a given applied voltage with a high degree of accuracy for operation over a wide band of frequencies.

Operational amplifiers, in general, are well known in the art for providing various mathematical operations upon given inputs by means of relatively simple circuitry. Basically, an operational amplifier comprises a high gain amplifier network having a feedback path coupling the output of said amplifier to its input whereby all but a small fraction of supplied current is conducted through the feedback path so that the voltage across the amplifier terminals closely approximates the supplied current multiplied by the feedback path impedance, the current remaining essentially constant for different values of impedance. Thus, the voltage across the amplifier is related to a given supply voltage by the ratio of the feedback impedance to the supply impedance. The accuracy of this relationship is directly related to the open loop gain of the circuit. It may be appreciated that an operational amplifier performs as would a current source in providing current to a variable impedance wherein the voltage appearing across the impedance is in essence entirely a function of the value of the impedance. Such current source operation is not readily provided without requiring an extremely high, stable voltage source which is difficult to achieve.

Operational amplifiers can be made to perform with a high degree of accuracy for a linear mathematical operation, where the shunt impedance does not change radically, by setting the open loop gain of the amplifier circuit at an appropriately high value. However, if the shunt impedance is variable to any appreciable extent, the performance of the circuit may be severely affected. In particular, with respect to an operational amplifier providing logarithmic output, a high degree of accuracy for the output over a wide range of operating frequencies, is difficult to achieve.

It is accordingly an object of the invention to provide a novel compensated operational amplifier which generates highly accurate functions over a wide range of operating frequencies.

It is another object of the invention to provide a novel compensated operational amplifier for generating highly accurate nonlinear functions over a wide frequency band.

It is a further object of the invention to provide a novel means for compensating the open loop gain of an operational amplifier which generates a linear or nonlinear function, so as to insure an output of high accuracy for operation over a wide range of frequencies.

It is a more particular object of the invention to provide a novel compensated logarithmic operational amplifier of the above described characteristics.

In general these and other objects of the invention are accomplished in an operational amplifier circuit which includes a high gain amplifier network having a feedback path coupled between the input and output terminals of said amplifier, in which path is inserted a given impedance for determining the function to be performed by the circuit. The major portion of current supplied to said amplifier circuit is conducted through the feedback impedance so that the voltage across the terminals of the amplifier is determined by the supply current and said impedance, being approximately equal to the product of the two. Compensating means, comprising a further impedance that is of matching characteristics with the feedback impedance is included in the amplifier circuit for modifying the gain of the amplifier as a function of the further impedance so that for variations in the value of the feedback impedance a relatively constant open loop gain is maintained. The magnitude of the open loop gain is established sufficiently high so that good accuracy of the output quantity is provided over a wide range of operating frequencies.

More specifically, with respect to the logarithmic amplifier embodiment of the invention, a pair of oppositely poled diodes coupled in shunt are inserted in the feedback path. The compensating means includes a second pair of oppositely poled shunt diodes of similar voltage-current characteristics to the feedback shunt diodes, the compensating diodes being inserted in the amplifier circuit so as to have a voltage applied thereacross equivalent to the voltage applied across the feedback shunt diodes. The compensating diodes modify the amplifier gain as a function of their impedance variation due to nonlinear voltage-current characteristics, which is the same as the impedance variation of the feedback diodes.

While the specification concludes with claims particularly pointing out and distinctly claiming the invention, it is believed that the invention will be better understood from the following description taken in connection with the accompanying drawings in which:

Figure 1:
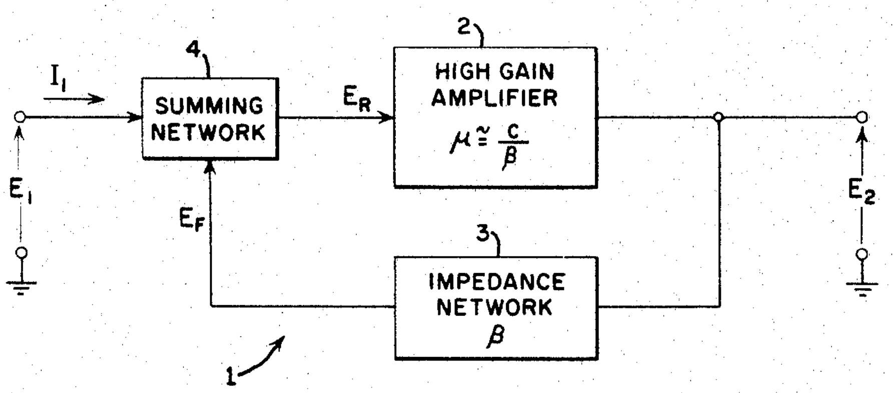
FIGURE 1 is a block diagram of a compensated operational amplifier in accordance with the invention.

Referring now to FIGURE 1, there is illustrated, in block diagram form, a compensated operational amplifier circuit 1 including a high gain amplifier network 2 and a feedback impedance 3. A major portion of the current supplied to the circuit is conducted through the feedback path so that for a constant supplied current the voltage across the impedance 3 is, in essence, a function solely of the impedance for a wide range of impedance values. In accordance with the invention, the amplifier circuit 1 is provided with a high and relatively constant open loop transfer function, or gain, commonly designated as the product $\mu\beta$, where $\mu$ is the gain of the amplifier network 2 and $\beta$ is the transfer function of the impedance network 3. The transfer function $\beta$ is inversely related to the feedback impedance of the network 3. The $\mu\beta$ product is maintained at a high value so as to ensure that the major portion of the circuit supplied current is conducted through the impedance network 3, thereby providing an accurate operation of the circuit in generating various mathematical functions for a wide range of impedances. By maintaining the $\mu\beta$ product approximately equal to a constant as the impedance changes, the range of operating frequencies is appreciably extended. In practice, even a rough approximation of the $\mu\beta$ product to a constant, e.g., within several db, is found to yield appreciable improvement in circuit operation over an uncompensated circuit, which will be more clearly shown when considering the frequency versus gain curves of FIGURE 3.

An input voltage $E_1$ is applied as a first input to a summing network 4, the output of which is coupled to amplifier network 2. The output of amplifier network 2, from which the circuit output $E_2$ is taken, is coupled back through a feedback path, which includes the impedance network 3, as a second input to summing network 4. The amplifier network 2 has a variable gain $\mu$, where $$\mu \cong \frac{C}{\beta}$$

C being a constant.

In the operation of the circuit of FIGURE 1, the voltage $E_1$ is applied to summing network 4 and added to a feedback voltage $E_F$ to provide at the output of the summing network an error voltage $E_R$. Since the gain of the amplifier 2 is high, the voltage $E_R$ is small with respect to $E_1$. Therefore, the input to the amplifier network 2 is at a virtual ground potential and the output voltage $E_2$ is essentially the voltage across the impedance network 3. The closed loop transfer function of the amplifier 1 may be expressed as $$\frac{E_2}{E_1} = \frac{-\mu}{1+\mu\beta} \quad (1)$$

Accordingly, if $\mu\beta$ is of a sufficiently high value the closed loop transfer function becomes a function solely of $\beta$. In other words, the ratio of the output voltage to the input voltage is a function entirely of the feedback impedance and the accuracy of the ratio is independent of the feedback impedance value so long as $\mu\beta$ remains high. The accuracy is, in fact, directly related to the magnitude of $\mu\beta$.

Another way to analyze the operation of the circuit is to consider the input current $I_1$ supplied by voltage $E_1$ as being substantially conducted through the feedback path, with but a small fraction thereof being coupled to the amplifier network 2 so that the voltage across the feedback impedance 3 is, in essence, equal to the product of the input current and the feedback impedance.

For any variations in the feedback impedance, e.g., due to voltage changes across the impedance network for nonlinear impedances or due to temperature variations for temperature sensitive impedances, which introduce changes in $\beta$, inversely related changes of comparable magnitude occur in the gain $\mu$ of amplifier network 2. Thus, the product $\mu\beta$ is maintained approximately constant.

Figure 2:
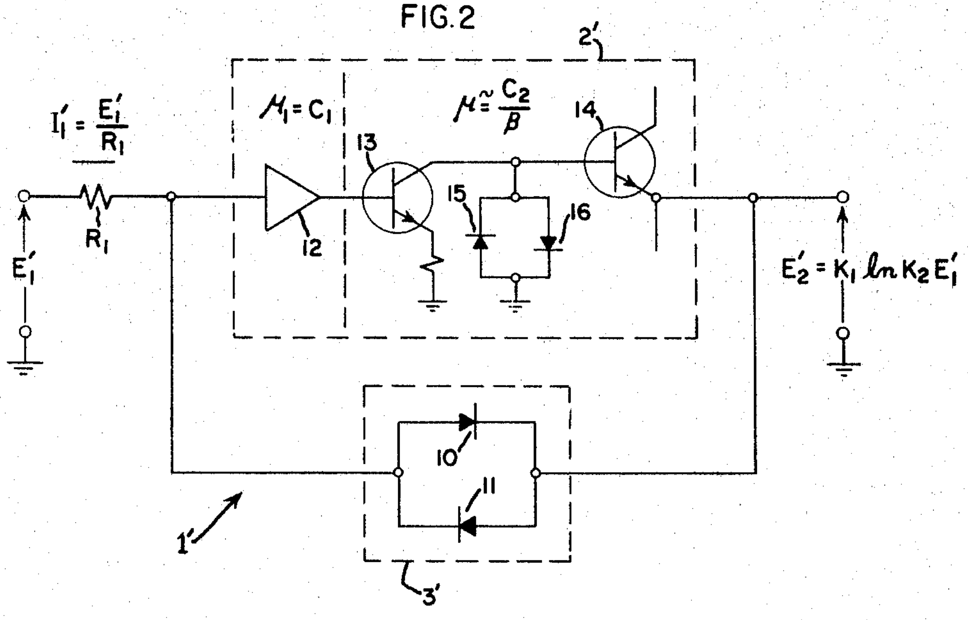
FIGURE 2 is a schematic diagram of a compensated logarithmic operational amplifier in accordance with the invention.

With reference to FIGURE 2, there is shown a schematic diagram of a compensated logarithmic operation amplifier circuit 1' which is based upon the block diagram of FIGURE 1. Components and variables in FIGURE 2 which correspond to those in FIGURE 1 are identified by the same legends with an added prime notation. The feedback impedance network 3' includes a pair of oppositely poled diodes 10 and 11 connected in shunt. Since it is well known that diodes have a logarithmic voltage-current characteristic, it may be appreciated that the output voltage $E_2'$ is a logarithmic function of the input voltage $E_1'$, so that $E_2' = K_1 \log K_2 E_1'$, where $K_1$ and $K_2$ are related to the diode parameters. The high gain amplifier network 2' is shown to include an amplifier component 12 in a first amplifier stage of fixed gain $\mu_1 = C_1$, and a second amplifier stage of variable gain $$\mu_2 \cong \frac{C_2}{\beta}$$

Thus $C \cong C_1 C_2$. The second stage of amplifier 2' is seen to include a common emitter connected transistor 13 and an emitter follower connected transistor 14. A pair of oppositely poled shunt diodes 15 and 16, of voltage-current characteristics similar to diodes 10 and 11, are connected from the junction of the collector of transistor 13 and the base of transistor 14 to ground so as to vary the gain $\mu$ of the amplifier 2' as a function of the impedance of diodes 15 and 16 and inversely with respect to $\beta$. Since shunt diodes 15 and 16 are coupled to the base electrode of emitter follower connected transistor 14, and since the input to amplifier 2' is at a virtual ground, the voltage across diodes 15 and 16 is about equal to the voltage across diodes 10 and 11. Comparable changes in impedance therefore occur with respect to each of the diode pairs as the circuit output voltage varies.

In the operation of the circuit of FIGURE 2, as with respect to FIGURE 1, the voltage $E_1'$ supplies a current of $I_1'$, which is essentially equal to the input voltage divided by the input impedance $R_1$. The major portion of this current is conducted through the impedance network 3' and the remaining small portion is supplied to amplifier 2'.

Because the diodes of the impedance network 3' have a logarithmic voltage-current characteristic, the diode impedance, and hence $\beta$, will vary as a logarithmic function of the current. Large variations in $\beta$ unless compensated will produce correspondingly large variations in the product $\mu\beta$, which may drastically reduce the accuracy of the generated function and limit the bandwidth of the circuit operation. The compensation provided to the $\mu$ of the amplifier network 2' by diodes 15 and 16 substantially improves the circuit operation with respect to these characteristics.

For an A.C. operation wherein the peak of the input waveform is assumed to be at a low amplitude, the impedance of diodes 10 and 11 of network 3' will be high, for which the value of $\beta$ is low. Since the impedance of shunt diodes 15 and 16 is matched to that of diodes 11 and 12 and is therefore also high, the fain $\mu_2$ of the second stage of amplifier 2' is high, as is then the overall gain $\mu$. The circuit parameters are selected so that $\mu\beta$ product for this condition has a high value for providing good accuracy and stable operation over a wide frequency band. Considering now a large peak amplitude of the input waveform, the impedance of network 3' is low and $\beta$ is therefore high. The impedance of diodes 15 and 16 is now also low so that the gain $\mu$ of the amplifier circuit 2' is reduced inversely as $\beta$ is increased, the product $\mu\beta$ remaining approximately constant. It may be appreciated that without the compensation provided by diodes 15 and 16, for the second condition the $\mu\beta$ product would have increased appreciably so as to tend to drive the circuit unstable. Thus, all changes in the feedback impedance due to voltage variations which would tend to alter the $\mu\beta$ product are approximately compensated for so as to provide stable operation and high accuracy.

Figure 3:
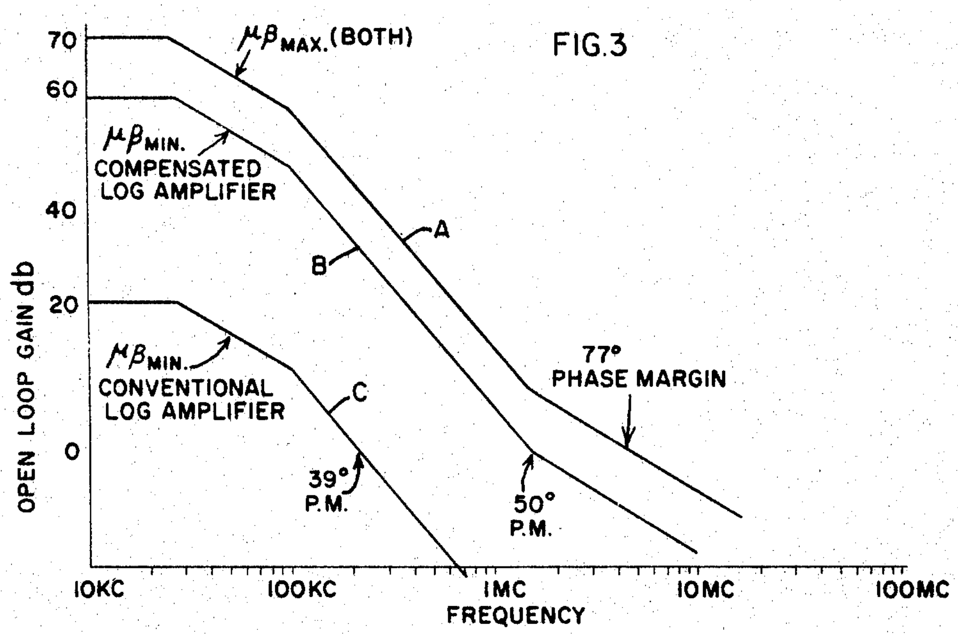
FIGURE 3 is a frequency versus gain graph which is employed in the description of the invention.

FIGURE 3 graphically demonstrates the frequency vs. gain characteristics of an exemplary compensated logarithmic amplifier as compared to a conventional, uncompensated logarithmic amplifier, wherein the feedback impedance of said amplifiers are variable over a given range of values during the circuit operation. Although the variations for logarithmic amplifiers are of a nonlinear type due to the nonlinear voltage current characteristic of the feedback impedance diodes, the following analysis applies equally to operational amplifiers, in general, wherein there may occur nonlinear as well as linear impedance changes.

Curve A shows the frequency vs. gain characteristic of a logarithmic amplifier for the condition of minimum feedback impedance within a given impedance range. Accordingly, the open loop gain $\mu\beta$ is a maximum. For this condition the value of $\mu$ is selected to be as high as possible and still maintain unconditional circuit stability. From the graph it is seen that the criterion for stability is met, i.e., the open loop gain $\mu\beta$ reduces to below one before the phase shift of the open loop changes by 180°.

Curve B illustrates the frequency vs. gain characteristic of the compensated logarithmic amplifier for a condition of maximum feedback impedance or minimum $\mu\beta$. It is seen that for curve B, the $\mu\beta$ value has changed but slightly from the initially considered condition. Small signal bandwidths varying from one to five megacycles have been readily obtained with accuracies of better than 1% out to frequencies beyond 100 kilocycles. By comparison, for the uncompensated logarithmic amplifier, the $\mu\beta$ value diminishes greatly at the condition of maximum impedance, as shown by curve C. For this circuit the bandwidth varies from about 30 kilocycles to 5 megacycles and the accuracy is but 10% in the low current region.

Figure 4:
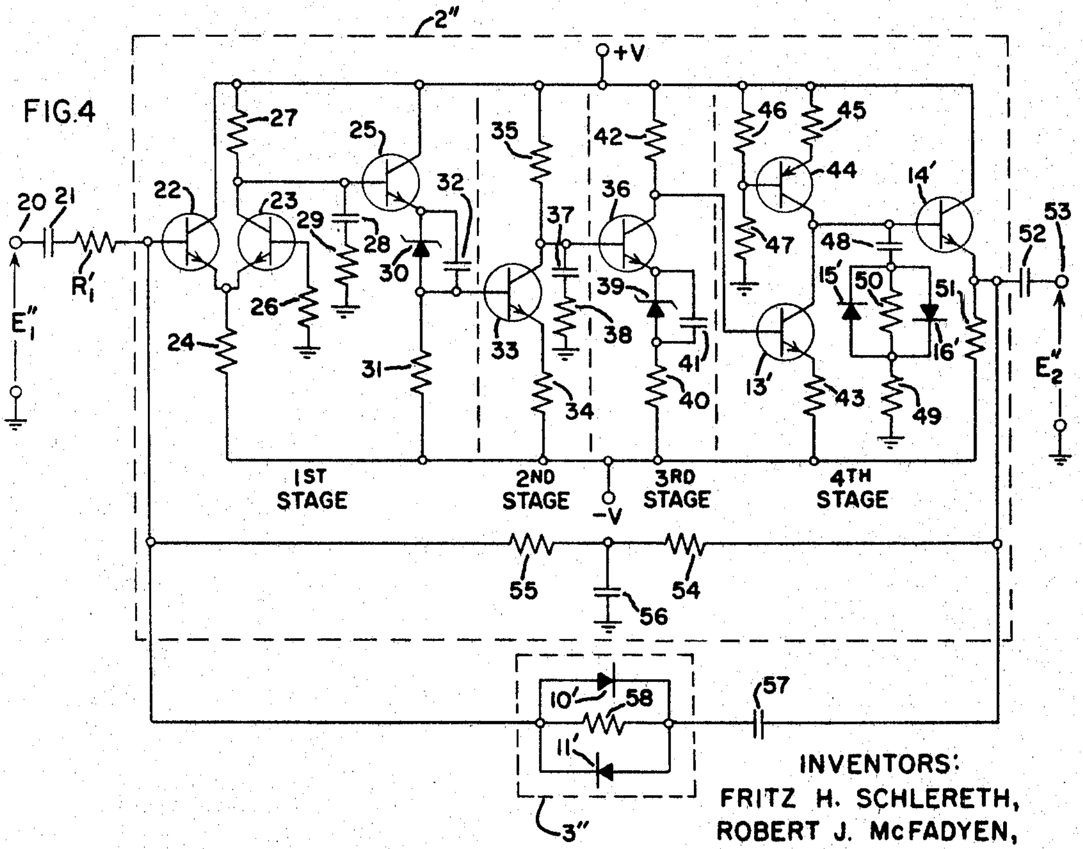
FIGURE 4 is a detailed circuit diagram of the amplifier of FIGURE 2.

With reference now to FIGURE 4, there is illustrated a detailed circuit diagram of the logarithmic operational amplifier of FIGURE 2. An added prime notation is used in FIGURE 3 for identifying the components and variables which correspond to those previously illustrated. Between input terminal 20 and ground is applied voltage $E_1''$. Terminal 20 is connected through an A.C. coupling capacitor 21 in series with an input resistor $R_1'$ to the amplifier network 2''. The amplifier network 2'' comprises three stages of fixed gain amplification, which together correspond to the amplifier component 12 of FIGURE 2, and a fourth stage of variable gain amplification in which are coupled the compensating diodes 15' and 16'.

The first amplification stage includes a pair of npn transistors 22 and 23, the emitters of which are jointly connected through a bias resistor 24 to bias source —V, and an emitter follower connected npn transistor 25. The base of transistor 23 is connected through a bias resistor 26 to ground. The collector of transistor 23 is connected through a bias resistor 27 to bias source +V and to the base of transistor 25. The base of transistor 15 is connected to ground through a shaping network including the serial connection of capacitor 28 and resistor 29. The emitter of transistor 25 is coupled to source —V through the serial connection of a Zener diode 30 and resistor 31, Zener diode 30 being shunted by an A.C. by-pass capacitor 32. The junction of Zener diode 30 and resistor 31 is connected to the base of an npn transistor 33 of the second stage of fixed amplification, the emitter of transistor 33 being connected through a resistor 34 to source —V and the collector thereof being connected by resistor 35 to source +V. The output from the second amplifier stage is connected from the collector of transistor 33 to the base of npn transistor 36 of the third stage of fixed amplification. The base of transistor 36 is connected to ground through a second shaping network including capacitor 37 and resistor 38. The emitter of transistor 36 is connected through a Zener diode 39 and resistor 40 to bias source —V, an A.C. coupling capacitor 41 shunting diode 39.

The collector of transistor 36 is connected through a bias resistor 42 to source +V, and is also connected to npn transistor 13' of the variable gain amplification stage. The emitter of transistor 13' is connected by a bias resistor 43 to source —V. The collector of transistor 13' is connected to the collector of a serially coupled pnp transistor 44 and also to the base of emitter follower connected npn transistor 14'. The emitter of transistor 44 is connected through a bias resistor 45 to source +V, and the base of said transistor is connected by a bias resistor 46 to source +V and by a further bias resistor 47 to ground. From the collector of transistor 13' is connected an A.C. coupling capacitor 48 connected in series with shunt diodes 15' and 16', which are connected through a bias resistor 49 to ground. In parallel with the shunt diodes 15' and 16' is a diode shaping resistor 50. The emitter of transistor 14' is connected by bias resistor 51 to source —V and by A.C. coupling capacitor 52 to output terminal 53. The transistor 14' emitter is further connected through a D.C. bias network to the base of transistor 22, the D.C. bias network including serially connected resistors 54 and 55, the junction of which is coupled by an A.C. by-pass capacitor 56 to ground. The emitter of transistor 14' is also coupled through an A.C. coupling capacitor 57 to the impedance network 3'', the diodes 10' and 11' of the impedance having connected in parallel therewith a diode shaping resistor 58.

The operation of the circuit of FIGURE 4 is substantially as described with respect to FIGURE 2 and will not be further considered.

In one operable embodiment of the invention the following circuit values and components were employed. These are given for purposes of illustration and are not intended to be limiting.

| | |
|---|---|
| Transistors **22, 23, 25, 33, 36, 13'** and **14'** | NPN type 2N918. |
| Transistor **44** | PNP type 2N3250. |
| Diodes **10', 11', 15'** and **16'** | FD600. |
| Zener diode **30** | 15 volts. |
| Zener diode **39** | 5.1 volts. |
| Resistors R1, **24, 26, 27, 43** and **46** | 1K ohms. |
| Resistor **29** | 75 ohms. |
| Resistors **31** and **49** | 240 ohms. |
| Resistor **34** | 300 ohms. |
| Resistor **35** | 3K ohms. |
| Resistor **38** | 10 ohms. |
| Resistor **40** | 220 ohms. |
| Resistor **42** | 2.2K ohms. |
| Resistor **45** | 430 ohms. |
| Resistors **47** and **51** | 1.2K ohms. |
| Resistor **50** | 10K–50K ohms. |
| Resistors **54** and **55** | 5K ohms. |
| Resistor **58** | 200K ohms. |
| Capacitors **21, 32, 41, 48, 52** and **56** | 2.2 $\mu f$. |
| Capacitor **28** | .0015 $\mu f$. |
| Capacitor **37** | .002 $\mu f$. |
| Capacitor **57** | 20 $\mu f$. |
| Bias source +V | 10 volts. |
| Bias source —V | —15 volts. |

It is intended that the appended claims include within their scope all modifications and changes falling within the true spirit of the invention.

What we claim as new and desire to secure by Letters Patent of the United States is:

1. A compensated logarithmic operational amplifier comprising:

(a) a high gain amplifier network of gain $\mu$ having an input terminal at virtual ground potential, (b) said network including a final amplification stage having a common emitter connected transistor, the collector electrode of which is coupled to the base electrode of an emitter follower connected transistor from which is taken the output of said network, (c) a feedback network of transfer function $\beta$ coupled from the output of said amplifier network to the input thereof, said feedback network including diode means of logarithmic voltage-current characteristics, (d) further diode means of voltage-current characteristics similar to that of the feedback diode means, said further diode means connected between the base electrode of said emitter follower connected transistor and ground, thereby having a voltage applied which corresponds to the voltage applied across said feedback diode means, so as to vary the gain of said common emitter connected transistor and hence the gain $\mu$ as a function of the further diode means impedance and inversely as a function of $\beta$, whereby in the presence of variations in $\beta$ compensating variations occur in $\mu$ for stabilizing the open loop gain $\mu\beta$, (e) means for applying an input voltage to said operational amplifier, and (f) means for obtaining an output voltage from said operational amplifier, for a wide range of changes in $\beta$ the output to input voltage ratio being to a high degree of accuracy a function solely of $\beta$.

2. A compensated logarithmic operational amplifier as in claim 1 wherein said feedback and further diode means each comprise a pair of oppositely poled shunt connected diodes.

References Cited

UNITED STATES PATENTS

| | | | |
|---|---|---|---|
| 3,041,535 | 6/1962 | Cochran | 307—88.5 |
| 3,058,068 | 10/1962 | Hinrichs et al. | 330—10 |
| 3,237,028 | 2/1966 | Gibbons | 307—88.5 |
| 3,252,007 | 5/1966 | Saari | 307—88.5 |

ARTHUR GAUSS, *Primary Examiner.*

H. DIXON, *Assistant Examiner.*